United States Patent [19]
Heuermann

[11] Patent Number: 6,008,656
[45] Date of Patent: Dec. 28, 1999

[54] ARRANGEMENT FOR CALIBRATING A NETWORK ANALYZER FOR ON-WAFER MEASUREMENT AT INTEGRATED MICROWAVE CIRCUITS

[75] Inventor: Holger Heuermann, Tittmoning, Germany

[73] Assignees: Rosenberger Hochfrequenztechnik GmbH & Co., Tittmoning; Karl Süss Dresden GmbH, Sacke, both of Germany

[21] Appl. No.: 08/938,888

[22] Filed: Sep. 26, 1997

[30] Foreign Application Priority Data

Sep. 26, 1996 [DE] Germany ............... 196 39 515

[51] Int. Cl.$^6$ ............................................. G01K 35/00
[52] U.S. Cl. ............................... 324/601; 324/754
[58] Field of Search ...................... 324/601, 158.1, 324/754; 402/85, 104, 106; 364/578

[56] References Cited

U.S. PATENT DOCUMENTS

| | | | |
|---|---|---|---|
| 3,333,724 | 8/1967 | Forcier | 324/754 |
| 4,871,964 | 10/1989 | Boll et al. | 324/754 |
| 4,982,164 | 1/1991 | Schiek et al. | 324/601 |
| 5,047,725 | 9/1991 | Strid et al. | 324/601 |
| 5,440,236 | 8/1995 | Schoek et al. | 324/601 |
| 5,442,296 | 8/1995 | Schiek et al. | 324/601 |
| 5,477,137 | 12/1995 | Staudinger et al. | 324/158.1 |
| 5,539,305 | 7/1996 | Botka | 324/158.1 |
| 5,587,934 | 12/1996 | Oldfield et al. | 702/85 |
| 5,666,059 | 9/1997 | Heuermann et al. | 702/107 |
| 5,784,299 | 7/1998 | Evers et al. | 702/85 |
| 5,793,213 | 8/1998 | Bockelmann et al. | 324/601 |

OTHER PUBLICATIONS

Data sheets for Wafer samplers: Semiautomatic High Frequency Probe System, PA200HF or Microwave Probe System PM5HF, of the Karl Suss Company, (undated).

Rosenberger, Product Note, TI 020/Apr. 18, 1996, E1.O, Calibration Substrate RCPW–LMR, REL. 20, pp. 1–4.

Zinke/Brunswick, Hochfrequenztechnik 1, $5^{th}$ ed., pp. 157 or 169–175, (undated).

*Primary Examiner*—Diep N. Do
*Attorney, Agent, or Firm*—Hill & Simpson

[57] ABSTRACT

In an arrangement for calibrating a network analyzer for on-wafer measurement, for microwave circuits on a metallic base plate, of a wafer measurement means using calibration standards constructed in coplanar line technology on a calibration substrate. The calibration substrate is spaced above the metallic base plate.

20 Claims, 1 Drawing Sheet

ARRANGEMENT FOR CALIBRATING A NETWORK ANALYZER FOR ON-WAFER MEASUREMENT AT INTEGRATED MICROWAVE CIRCUITS

BACKGROUND OF THE INVENTION

The invention relates to an arrangement for calibrating a network analyzer for on-wafer measurement at integrated microwave circuits on a metallic base plate of a wafer measurement installation using calibration standards constructed in coplanar line technology on a calibration substrate.

In the manufacture of integrated microwave circuits on semiconductor wafers, the circuits must often be electrically measured even before the division of the wafer (on-wafer measurement). For this purpose, special wafer measurement means (wafer samplers) are known, which have a metallic base plate (chuck) having vacuum openings distributed over the surface, which are connected with a partial vacuum means. The wafer is thus held on this flat base plate by a partial vacuum. Above the base plate, mounts are provided for measurement prods, and measurement points on the clamped-on wafer selected in this way can be driven and contacted by means of precise displacement of the base plate in the X, Y and Z direction (see e.g. the data sheet for the wafer samplers PA200HF or PM5HF of the Süβ company, or measurement prods according to U.S. Pat. No. 4,871, 964).

For on-wafer measurements of this sort at microwave circuits, vectorial network analyzers are used, in which what is known as a system error correction is required before a measurement. Calibration measurements are carried out according to known calibration methods at several calibration standards whose electrical characteristic quantities are known in whole or in part. Correction data is obtained from these measurements via specific computing methods, which data is subsequently taken into account in the actual object measurement for error correction (e.g. see U.S. Pat. No. 4,982,164).

For the calibration of such network analyzers for on-wafer measurement, calibration standards have proven useful that are fashioned in coplanar line technology, e.g. as a coplanar line, a coplanar double-band line or an asymmetrical coplanar lie on a calibration substrate (coplanar striplines e.g. according to Zinke/Brunswick, Hochfrequenztechnik 1, $5^{th}$ ed., p. 157 or 169–176). Coplanar striplines have low dispersion and have, over a large bandwidth, a small change in the wave resistance, as well as a low frequency dependence of the electrical length. Such calibration standards in coplanar stripline technology are for example manufactured on a substrate from sapphire or aluminum oxide in thin film technology. A calibration standard particularly suited for such purposes, as offered for example by the Rosenberger company (calibration substrate RCPW-LMR in produce publication TI 020/18.04.96/E1.0) uses two short coplanar stripline segments (LL) formed on a calibration substrate, with a known characteristic impedance and two short-circuit beams (R). Before the actual on-wafer object measurement, this calibration substrate is set on the base plate of the wafer measurement means, and by means of the measurement prods, which are connected with the network analyzer, the mentioned calibration measurements, e.g., according to the LLR method, are carried out successively at the calibration standards L, L and R.

In microwave circuits fashioned on semiconductor substrates (wafers), only a small part of the substrate thickness (about 500 $\mu$m) up to a depth of about 10 $\mu$m has an influence on the electrical behavior of the circuit. The measurement results in on-wafer measurement are thus not adversely affected by the metallic base plate during the actual object measurement. However, it has turned out that in calibration measurement, considerable measurement errors occur especially at higher frequencies in the GHz range, during measurement of the calibration standard constructed in coplanar line technology. As a consequence correction errors occur during object measurement.

SUMMARY OF THE INVENTION

It is an object of the present invention to provide a calibration arrangement of the type named above in which such measurement errors are avoided during calibration.

In general terms, the present invention is an arrangement for calibrating a network analyzer for on-wafer measurement, for microwave circuits on a metallic base plate, of a wafer measurement means using calibration standards constructed in coplanar line technology on a calibration substrate. The calibration substrate is spaced above the metallic base plate.

Advantageous developments of the present invention are as follows.

A dielectric material, or several layers of different dielectric materials, including air, is provided in the space between the metallic base plate and the calibration substrate.

An air chamber is provided between the calibration substrate and the metallic base plate.

The wafer measurement has a partial vacuum means for holding the wafer on the base plate surface. An air chamber connected with the partial vacuum means is constructed in the upper side of the base plate, and the calibration substrate is arranged above this air chamber.

The air chamber is covered with a cover plate made of dielectric material. The calibration substrate is arranged on the upper side of this cover plate.

Suction openings for holding the calibration substrate are constructed i the cover plate.

The cover plate is countersunk in an edge groove surrounding the air chamber, and is arranged so as to be flush with the surface of the base plate.

The cover plate is constructed from a dielectric material having the same dielectric characteristics as the calibration substrate.

The suction openings constructed in the cover plate are provided in regions in which no calibration standards are present when the calibration substrate is applied.

The longitudinal and transverse dimensions of the air chamber are selected smaller than those of the calibration substrate. The calibration substrate is held directly on the edge of the air chamber by a partial vacuum.

The calibration substrate is arranged on the surface of a flat box housing open at the top, whose base can beset on the surface of the base plate.

The calibration substrate forms the cover of the box housing above an air chamber.

The box housing is held on the surface of the base plate by a partial vacuum.

In the base of the box housing at least one opening that can be connected with the partial vacuum means is constructed. The calibration substrate is likewise held on the box housing by a partial vacuum.

The box housing is sealed on the upper side with a cover plate that has suction openings. The calibration substrate lies on this cover plate.

The invention is based on the finding that the mentioned measurement errors in calibration with coplanar calibration standards are caused by the influence of the metallic base plate of the wafer measurement means. On the basis of the metallic base plate under the calibration substrate, no pure, easily calculable coplanar field type can form. Investigations have shown that, in particular at higher frequencies, a dominating micro-stripline field type forms along the coplanar lines of the calibration standards. Due to the metallic base plate, the electromagnetic field of the coplanar calibration standard is thus not only adversely affected, but rather is even changed from a field distribution of a coplanar line to a field distribution of a micro-stripline. The field types or, respectively, wave types of a coplanar line and of a micro-stripline not only differ in their field image, but also cause a wave resistance of a different magnitude and different electrical lengths of the lines. By means of the change of the field type, at higher frequencies these electrical characteristic quantities are also substantially altered, which causes the mentioned measurement errors.

This effect is avoided by the inventive measure of the present invention The calibration standards are arranged at a spacing above the metallic base plate of the wafer measurement means that is large enough that during calibration a pure and unfalsified coplanar field type forms along the calibration standard, and a micro-stripline field type with a large frequency dependence (dispersion) is avoided.

According to the present invention, the influences of the vacuum bores in the metallic base plate of the wafer measurement means on the calibration are also avoided. The vacuum bores, which are relatively large in relation to the calibration standards, change the electrical line characteristic of the calibration standard considerably, given calibration standards set immediately on the base plate. Measurement standards caused thereby are also avoided by the inventive measure.

The increased spacing between the calibration standard and the metallic base plate can be realized in various ways. The simplest solution is to deposit the calibration substrate on a correspondingly thick plate made of a dielectric. However, the best-calculable ratios are achieved if only air is located under the calibration substrate, in the ideal case a vacuum. If only air is located between the calibration substrate and the base plate, the calibration standards can be calculated and manufactured very precisely, since no adverse effect due to other dielectric materials occurs, provided that there is also a sufficiently large lateral spacing between the calibration standards constructed in coplanar line technology and the edges of the air chamber.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawing, in which:

DESCRIPTION OF THE PREFERRED EMBODIMENTS

Figure 1:
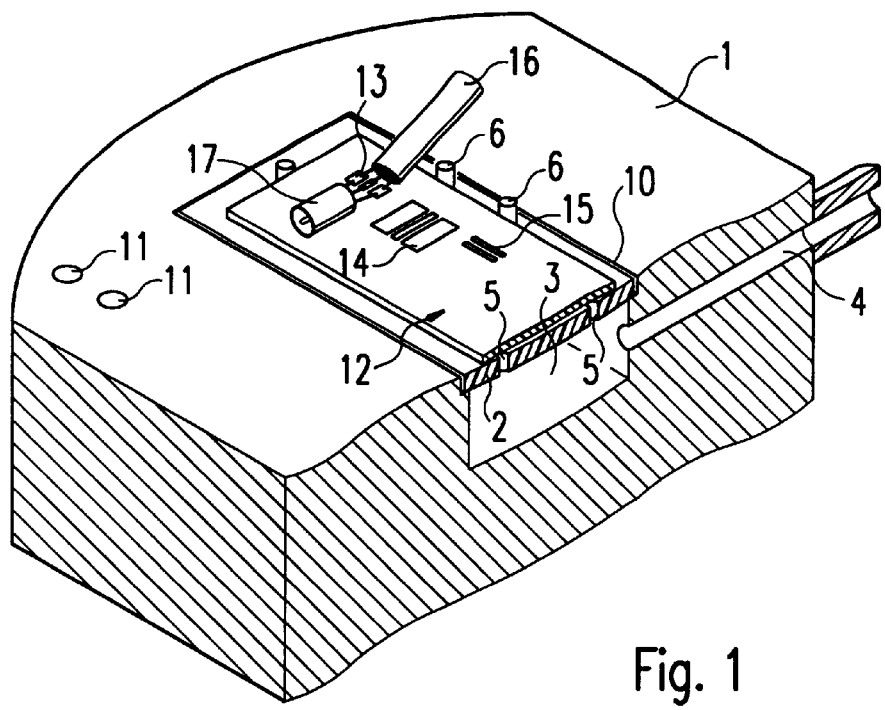
FIG. 1 is a perspective view of one embodiment of the present invention.

FIG. 1 shows a highly enlarged view of the partial segment of a metallic base plate 1 of a wafer measurement means, in a partially sectional view. In the surface of the base plate (chuck), a chamber 3 is milled out from above, a circumferential edge groove 10, in which a cover plate 2 of dielectric material is set. The air chamber 3 is formed outside the region in which the wafer (not shown) is normally clamped on. If necessary, in the edge region of the base plate 1 several such chambers 3 for accepting calibration standards can also be fashioned. The material of the cover plate 2 preferably has the same dielectric characteristics as the calibration substrate 12. The interior of the chamber 3 is connected with the vacuum pump (not shown) of the wafer measurement means via a channel 4. The vacuum bores distributed over the surface of the base plate 1 for the holding of the wafer during on-wafer measurement are also connected with this vacuum pump. Vacuum bores 5 are likewise fashioned in the cover plate 2, via which a calibration substrate 12 laid on the upper side of the cover plate 2 is held by a partial vacuum. On the calibration substrate 12 with a thickness of e.g. 635 µm two L-(line-) calibration standards 13 and 14 in coplanar line technology are fashioned for example in thin-layer technology next to one another, respectively consisting of three strips of predetermined length, dimensioned in a known way with respect to width and spacing. A third R-(reflection-) calibration standard 15 is formed by two strips lying next to one another. Via schematically indicted measurement prods 16, 17, which are mounted above the base plate on the wafer measurement means and are connected to the network analyzer (not shown), the strips of the calibration standard are contacted during calibration. The vacuum bores 5 in the cover plate 2 are distributed such that they respectively lie outside the calibration standard, and thus have no disturbing influence on the coplanar lines. In order to ensure the exact geometrical position of the calibration substrate 12 on the cover plate 2, additional alignment pins 6 are also provided, which are preferably set in the clamping plate 1 at the edge of the air chamber.

Another possibility is to choose the dimensions of the air chamber 3 smaller than the longitudinal and transverse dimensions of the calibration substrate 12, so that the calibration substrate 12 lies immediately on the edge of the air chamber 3 without the interposition of a cover plate 2, and is held by a vacuum.

Figure 2:
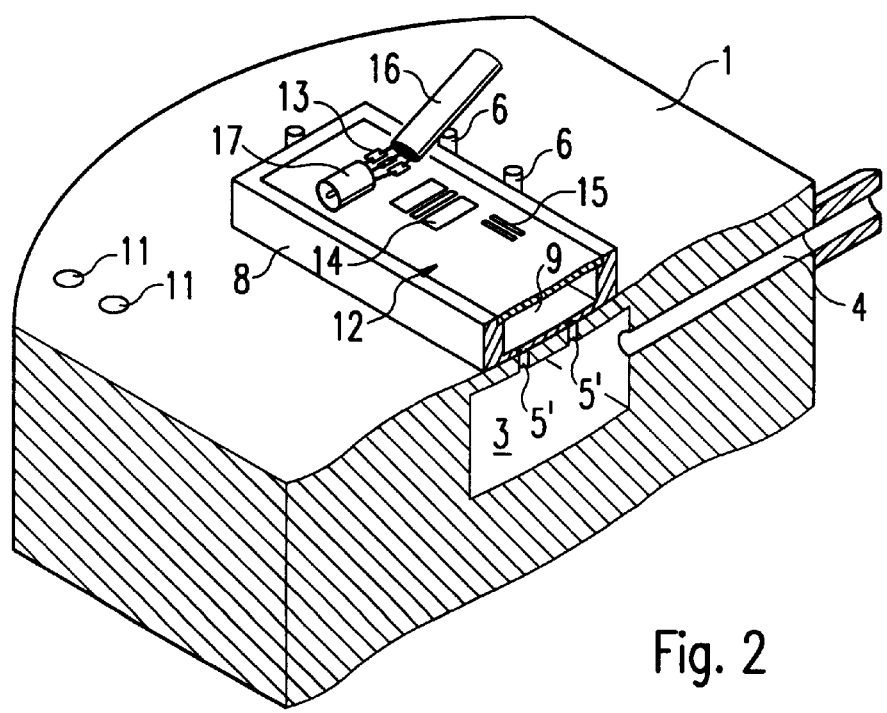
FIG. 2 is a perspective view of another embodiment of the present invention.

FIG. 2 shows a further possibility for attaching the calibration standard at a spacing from the metallic base plate 1. In this exemplary embodiment, the base plate of a standard wafer measurement means can remain unaltered. In this exemplary embodiment, the calibration means is set on the surface of the base plate 1 as a separate component, and is held by means of the vacuum bores 11 provided in the base plate for holding the wafer. For the rough positioning of the calibration means, alignment pins 6 are again provided at one or more points in the edge region of the base plate. The calibration substrate 12, with the calibration standard 13, 14, 15, again constructed in coplanar line technology, is fashioned as the cover of a small flat box-type housing 8, preferably again in a circumferential annular groove on the edge of the box housing. It is fastened in a suitable way to the housing. The housing 8 consists either of a dielectric material, preferably metal, since the calibration standards can hereby be precisely defined, calculated and manufactured. The flat closed base of the box housing 8 is held on the surface of the base plate 1 via the vacuum bores 5. An air chamber 9 is fashioned in the interior of the box housing 8 between the housing base and the calibration substrate 12.

A further possibility is to provide an opening in the base of the box housing 8 that is flush with the vacuum bores 5', so that a vacuum also forms in the air chamber 9. In this case, the calibration substrate 12 can then be mounted on the edge of the box housing 8 by means of a partial vacuum, and can be exchanged easily with other calibration standards.

The spacing between the calibration substrate and the metallic base plate for avoiding a transformation of the coplanar field type into a micro-stripline field type depends on the type of coplanar lines used, and also on the thickness and the material of the calibration substrate. In general, it suffices to select this spacing at about 2 mm. In the air chamber 3 or, respectively, 9, an absorber material can also be arranged, which avoids disturbing effects such as, for example, electrical hollow space resonances.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A calibration standard arrangement, comprising:
    a wafer measurement device having a metallic base plate; and
    a calibration substrate having thereon calibration standards constructed in coplanar line technology against which a network analyzer can be calibrated by way of a calibration measurement, said calibration standards being located within a calibration standards portion of the calibration substrate;
    the calibration substrate being located relative to the metallic base plate such that the calibration standards portion is located in spaced apart relation from any portion of the metallic base plate thereby forming a space between the calibration standards portion and the metallic base plate large enough so that influences of the metallic base plate on the calibration standards portion giving rise to high-frequency dependent micro-stripline fields during calibration measurement are avoided.

2. The arrangement according to claim 1, wherein the arrangement further comprises at least one layer of a dielectric material in the space between the metallic base plate and the calibration substrate.

3. The arrangement according to claim 1, wherein the arrangement further comprises an air chamber in the space between the calibration substrate and the metallic base plate.

4. The arrangement according to claim 1, wherein the wafer measurement device has a partial vacuum means for holding a wafer on a surface of the base plate, and an air chamber connected with the partial vacuum means and located in an upper side of the base plate, and wherein the calibration substrate is located above the air chamber.

5. The arrangement according to claim 4, wherein longitudinal and transverse dimensions of the air chamber are respectively smaller than longitudinal and transverse dimensions of the calibration substrate, and wherein the calibration substrate is held directly on an edge of the air chamber by a partial vacuum.

6. The arrangement according to claim 4, wherein air chamber is covered with a cover plate made of dielectric material, and wherein the calibration substrate is located on an upper side of the cover plate.

7. The arrangement according to claim 6, wherein the cover plate has vacuum openings for holding the calibration substrate.

8. The arrangement according to claim 7, wherein the vacuum openings constructed in the cover plate are located in regions in which no calibration standards are present when the calibration substrate is positioned above the metallic base plate.

9. The arrangement according to claim 6, wherein the cover plate is countersunk in an edge groove surrounding the air chamber, and is arranged flush with the upper side of the base plate.

10. The arrangement according to claim 6, wherein the cover plate is constructed from a dielectric material having substantially common dielectric characteristics with dielectric characteristics of the calibration substrate.

11. The arrangement according to claim 1, wherein the arrangement further comprises a flat box housing and wherein the calibration substrate is arranged on a surface of the flat box housing open at a top of the flat box housing, a base of the flat box being located on a surface of the base plate.

12. The arrangement according to claim 11, wherein the calibration substrate forms a cover of the box housing and wherein an interior of the box housing forms an air chamber in the space.

13. The arrangement according to claim 11, wherein the box housing is held on the surface of the base plate by a partial vacuum.

14. The arrangement according to claim 11, wherein the box housing has in a base thereof at least one opening that is connected with a means for forming a the partial vacuum, and wherein the calibration substrate is likewise held on the box housing by a partial vacuum.

15. The arrangement according to claim 11, wherein the box housing is sealed on an upper side thereof with a cover plate that has vacuum openings, and wherein the calibration substrate lies on the cover plate.
    calibration substrate being located above the air chamber thereby forming a space between the calibration substrate and the metallic base plate.

16. A calibration standard arrangement, comprising:
    a wafer measurement device having a metallic base plate, the wafer measurement device having a partial vacuum means for holding a wafer on a surface of the base plate, and having an air chamber connected with the partial vacuum means and located in an upper side of the base plate;
    a calibration substrate having thereon calibration standards constructed in coplanar line technology against which a network analyzer can be calibrated by way of a calibration measurement, said calibration standards being located within a calibration standards portion of the calibration substrate; and
    said calibration substrate being located above the air chamber thereby forming a space between the calibration substrate and a floor of the air chamber of the metallic base plate, the calibration standards portion being located such that a space exits between the calibration standards portion and the metallic base plate large enough so that influences of the metallic base plate on the calibration standards portion giving rise to high-frequency dependent micro-stripline fields during a calibration measurement are avoided.

17. The arrangement according to claim 16, wherein air chamber is covered with a cover plate made of dielectric material, and wherein the calibration substrate is located on an upper side of the cover plate wherein the cover plate has vacuum openings for holding the calibration substrate.

18. The arrangement according to claim 17, wherein the vacuum openings constructed in the cover plate are located in regions in which no calibration standards are present when the calibration substrate is positioned above the metallic base plate.

19. A calibration standard arrangement, comprising:

a wafer measurement device having a metallic base plate; and a calibration substrate having thereon calibration standards constructed in coplanar line technology against which a network analyzer can be calibrated by way of a calibration measurement, said calibrating standards being located within a calibrating standards portion; said calibration substrate being located relative to the metallic base plate such that a space is formed between the calibration standards portion and the metallic base plate; said space being large enough such that influences of the metallic base plate on the calibration standards portion giving rise to high-frequency dependent micro-stripline fields during calibration measurements are avoided: and a flat box housing, the calibration substrate being arranged on a surface of the flat box housing open at a top of the flat box housing, and a base of the flat box being located on a surface of the base plate.

20. The arrangement according to claim 19, wherein the calibration substrate forms a cover of the box housing and wherein an interior of the box housing forms an air chamber in the space, and wherein the box housing is held on the surface of the base plate by a partial vacuum.

* * * * *